(12) United States Patent
Cheng et al.

(10) Patent No.: US 7,845,975 B2
(45) Date of Patent: Dec. 7, 2010

(54) LOW-PROFILE CONNECTOR ASSEMBLY AND METHODS

(75) Inventors: Yican Cheng, Yueqing (CN); Tsou Cheng Jung, Tao Yuan Hsien (TW); Mark Jackson, San Diego, CA (US)

(73) Assignee: Pulse Engineering, Inc., San Diego, CA (US)

( * ) Notice: Subject to any disclaimer, the term of this patent is extended or adjusted under 35 U.S.C. 154(b) by 232 days.

(21) Appl. No.: 12/011,796

(22) Filed: Jan. 29, 2008

(65) Prior Publication Data

US 2008/0299826 A1 Dec. 4, 2008

Related U.S. Application Data

(60) Provisional application No. 60/898,677, filed on Jan. 30, 2007.

(51) Int. Cl.
*H01R 13/60* (2006.01)
(52) U.S. Cl. .............................. 439/541.5; 439/607.21; 439/607.23; 439/939
(58) Field of Classification Search ............. 439/541.5, 439/607.04, 607.17, 607.19, 607.2, 607.21, 439/607.23, 939
See application file for complete search history.

(56) References Cited

U.S. PATENT DOCUMENTS

| | | | |
|---|---|---|---|
| 5,329,428 A * | 7/1994 | Block et al. ................. | 361/785 |
| 5,547,398 A | 8/1996 | Ichikawa et al. | |
| 6,276,963 B1 | 8/2001 | Avery et al. | |
| 6,469,905 B1 | 10/2002 | Hwang | |
| 6,517,382 B2 | 2/2003 | Flickinger et al. | |
| 6,558,191 B2 | 5/2003 | Bright et al. | |
| 6,582,244 B2 | 6/2003 | Fogg et al. | |
| 6,600,865 B2 | 7/2003 | Hwang | |
| 6,609,928 B1 * | 8/2003 | Le ........................... | 439/541.5 |
| 6,666,694 B1 | 12/2003 | Daly et al. | |
| 6,729,905 B1 | 5/2004 | Hwang | |
| 6,824,429 B2 | 11/2004 | Hwang | |
| 6,866,544 B1 * | 3/2005 | Casey et al. .............. | 439/607.2 |
| 6,972,968 B2 | 12/2005 | Hwang | |
| 7,070,446 B2 * | 7/2006 | Henry et al. ............. | 439/541.5 |
| 7,081,011 B2 * | 7/2006 | Kikuchi et al. ........... | 439/541.5 |
| 7,261,591 B2 | 8/2007 | Korsunsky et al. | |
| 7,488,212 B2 * | 2/2009 | Chen ...................... | 439/607.01 |
| 7,575,471 B2 * | 8/2009 | Long ....................... | 439/541.5 |
| 2008/0299826 A1 * | 12/2008 | Cheng et al. ................ | 439/607 |
| 2009/0098767 A1 * | 4/2009 | Long ....................... | 439/541.5 |

* cited by examiner

*Primary Examiner*—James Harvey
(74) *Attorney, Agent, or Firm*—Gazdzinski & Associates, PC

(57) ABSTRACT

An electrical connector assembly having shielded cage assembly with a plurality of ports for receiving modules. In one embodiment, the modules comprise SFP (small form-factor pluggable) modules, and the electrical connector assembly is adapted for low-profile applications, thereby optimizing the amount of area and volume occupied by the SFP assembly. In one variant, the SFP modules are pluggable into individual ports, whereby two modules are interconnected to a single header connector interconnected to a motherboard. Methods of manufacturing the connector assembly are also disclosed.

36 Claims, 18 Drawing Sheets

# LOW-PROFILE CONNECTOR ASSEMBLY AND METHODS

PRIORITY

This application claims priority to U.S. Provisional Patent Application Ser. No. 60/898,677 filed Jan. 30, 2007 of the same title, which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The present invention relates generally to electrical or electronic connector systems and in one exemplary aspect, to low-profile connector systems for pluggable electronic modules, such as transceiver modules for high-speed fiber optic and copper communications, and methods for manufacturing the same.

DESCRIPTION OF RELATED TECHNOLOGY

Small form-factor pluggable ("SFP") optical transceiver modules that combine transmitter and receiver functions in a compact package format are well known in the prior art. Such SFP modules are used to support, inter alia, Fibre Channel and Gigabit Ethernet (GBE) applications with data rates between 1 Gbps and 4 Gbps, and a planned operating speed of up to 8 Gbps or more. SFP connector assemblies into which the SFP modules are pluggable are also well known. Examples of these pluggable-type connector assemblies can be found in disclosures such as U.S. Pat. No. 6,276,963 to Avery, et al. issued Aug. 21, 2001 and entitled "Adapter frame assembly for electrical connectors", incorporated herein by reference in its entirety. The Avery '963 patent discloses an adapter frame assembly for receiving at least a pair of connectors in a stacked array with one connector above another connector at a different spacing there between. The assembly includes a pair of frame structures including a top frame structure and a bottom frame structure, each including a receptacle for receiving a respective one of the stacked connectors. The top frame structure may be mounted directly on top of the bottom frame structure and, thereby, place the receptacles and the respective connectors at a first spacing. A spacer is selectively mountable between the frame structures to space the receptacles and the respective connectors at a second, increased spacing.

Other pluggable connectors and/or receptacles are evidenced in the prior art. For example, U.S. Pat. No. 6,517,382 to Flickinger, et al. issued Feb. 11, 2003 and entitled "Pluggable module and receptacle" discloses a receptacle for a pluggable module that includes a housing having a front, a back wall, a top wall, a bottom wall, and side walls and defining a cavity for receiving a module. The bottom wall has a bottom opening to receive a receptacle connector, and the front has a front opening to receive the module. The walls of the housing are made from a conductive material. A plurality of elongated members extend down from the housing past the bottom wall. The elongated members are adapted for electrical connection to a host circuit board such that the walls of the housing are electrically connected to the host circuit board.

U.S. Pat. No. 7,070,446 to Henry, et al. issued Jul. 4, 2006 and entitled "Stacked SFP connector and cage assembly" discloses an electrical connector assembly having a stamped and formed shielded cage having a plurality of ports for receiving SFP modules. The cages have an opening extending through a lower face thereof for receiving a header connector having first and second extensions which are aligned with the first and second columnar ports in the cage. Thus, the SFP modules are pluggable into individual ports, whereby two modules are interconnected to a single header connector interconnected to a motherboard.

United States Patent Publication No. 20020025720 to Bright, et al. published on Feb. 28, 2002 and entitled "Stacked transceiver receptacle assembly" discloses transceiver receptacles mounted on both sides of an intermediate circuit board. Each of the transceiver receptacles includes a host connector disposed within a shielding cage. The host connector is electrically connected to the intermediate circuit board and is configured for electrically mating with a respective transceiver module and the shielding cage is configured to receive and guide the respective transceiver module into mating engagement with the host connector. An electrically conductive bezel spacer is disposed in gaps between the shielding cages to reduce propagation of electromagnetic interference. Mating connectors electrically connect the intermediate circuit board to a main circuit board.

United States Patent Publication No. 20020146926 to Fogg, et al. published on Oct. 10, 2002 and entitled "Connector interface and retention system for high-density connector" discloses a plug and receptacle assembly that comprises a plug connector and receptacle connector for high-density interconnections of data cable. The two connectors are shielded and include a mating profile that includes a modified D-shaped configuration where one end of the shroud includes a concave radiused portion and two jackscrews or threaded inserts are located within the area formed by the concave radiused portion.

United States Patent Publication No. 20020197043 to Hwang, published on Dec. 26, 2002 and entitled "Stacked GBIC guide rail assembly" discloses a stacked Gigabyte Interface Converter (GBIC) guide rail assembly for removable optoelectronic modules that includes a raiser mounted on a circuit board, a plurality of guide rails fixed to the raiser, and a plurality of spacers spacing the guide rails from each other. The guide rails receive and accommodate transceivers therein for forming a dense arrangement of the transceivers. The lowest guide rail is mounted and supported on the circuit board.

Although past conventional pluggable designs have been used successfully in the past, they have tended to be unsuitable for further miniaturization, an ever-constant objective in the telecommunications industry. As SFP optical transceiver module technology has progressed, it has become increasingly desirable to miniaturize the transceivers and the assemblies which house them in order to inter alia increase the port density associated with the network connection, such as, for example, switch boxes, cabling patch panels, wiring closets, and computer I/O. In addition to miniaturizing the module, it is also desirable to increase its operating frequency (and hence data rate). For example, applications are quickly moving from the sub-gigabit per second realm to well over a gigabit per second.

Miniaturizing a module while maintaining or increasing its operating speed presents a number of design problems. Of particular concern is reducing electromagnetic interference (EMI) emissions. Due to FCC regulations, there is a need not only to minimize the EMI emissions of the module, but also to contain the EMI emissions of the host system in which the module is mounted regardless of whether or not a module is plugged in to the receptacle.

Therefore, there is a need for a connection system design that can be made to conform to existing standards (such as e.g., the SFP standard) while minimizing EMI emissions, increasing port density and providing convenient operation.

SUMMARY OF THE INVENTION

The present invention fulfills the foregoing needs by providing, inter alia, a low-profile connector (as compared to prior art designs) while offering novel features that improve EMI performance of the connector assembly.

In a first aspect of the invention, an electrical connector is disclosed. In one embodiment, the electrical connector is mountable on a printed circuit board such as in a telecommunications apparatus, and comprises an insulative housing having an upper and a lower printed circuit card receiving slot. The electrical connector further comprises a shield member assembly at least partly enclosing the insulative housing, with the shield member assembly comprising a top surface and a bottom surface. The electrical connector is further adapted so that the top surface of the shield member assembly resides above the printed circuit board and the bottom surface resides below the printed circuit board.

In one variant, the insulative housing comprises a lower surface having a plurality of terminals protruding therefrom and residing between the top and bottom surfaces of the shield member.

In yet another variant, the shield member comprises a plurality of tabs residing substantially in plane with the lower surface of the insulative housing.

In yet another variant, the plurality of tabs comprises at least a first and a second tab wherein the distance between a front surface of the shield member and the first and second tabs differs.

In yet another variant, the electrical connector further comprises an ejection shield resident within at least one of an upper or a lower transceiver receiving slots of the shield member.

In yet another variant, at least a portion of the ejection shield is received within the insulative housing.

In yet another variant, the insulative housing further comprises a plurality of alignment slots and the shield member comprises a plurality of alignment features, with the plurality of alignment features adapted to be received within respective ones of the plurality of alignment slots.

In yet another variant, the plurality of alignment features comprises at least two alignment features on a side surface of the insulative housing, wherein the alignment features are resident on two different planes between the top and bottom surfaces of the shield member.

In yet another variant, the shield member assembly comprises an upper and a lower transceiver receiving cavity, at least a portion of the lower transceiver receiving cavity resides below the printed circuit board.

In a second aspect of the invention, a method of manufacturing an electrical connector is disclosed. In one embodiment, the method comprises molding an insulative housing comprising an upper and a lower printed circuit card receiving slot; forming a shield member assembly comprising a top surface and a bottom surface; and inserting the insulative housing at least partly inside the shield member assembly, thereby creating the electrical connector and disposing the electrical connector on the printed circuit board so that the top surface resides above the printed circuit board and the bottom surface resides below the printed circuit board.

In one variant, the method further comprises disposing a plurality of terminals below a lower surface of the insulative housing between the top and bottom surfaces of the shield member assembly.

In yet another variant, the act of forming the shield member assembly further comprises forming a plurality of tabs that reside substantially in plane with the lower surface of the insulative housing.

In yet another variant, the method further comprises forming an ejection shield and placing the ejection shield within at least one of an upper or a lower transceiver receiving slots of the shield member.

In yet another variant, the act of placing the ejection shield further comprises inserting at least a portion of the ejection shield within the insulative housing.

In yet another variant, the method further comprises molding a plurality of alignment slots within the insulative housing and forming a plurality of alignment features in the shield member assembly that are adapted to be received within respective ones of the plurality of alignment slots.

In yet another variant, the plurality of alignment features comprise at least two alignment features on a side surface of the insulative housing that are resident on two different planes between the top and bottom surface of the shield member assembly.

In a third aspect of the invention, a method of using an electrical connector mountable on a printed circuit board in a telecommunications apparatus is disclosed. The method comprises forming a printed circuit board substrate comprising a top surface and a bottom surface; inserting a cut-out in the printed circuit board substrate; plating a plurality of signal paths on the printed circuit board substrate; and placing the electrical connector on the printed circuit board substrate, so that the electrical connector has a first surface disposed below the bottom surface of the printed circuit board substrate and a second surface disposed above the top surface of the printed circuit board substrate.

In one variant, the cut-out is substantially rectangular in shape and comprises a length and a width, with the length being larger in dimension than the width and wherein the cut-out is resident on an edge of the printed circuit board substrate with the length of the cut-out extending away from the edge.

In yet another variant, the plurality of signal paths comprises both a plurality of plated through-holes and a plurality of surface mountable plated areas.

In yet another variant, at least a portion of the plurality of surface mountable plated areas is closer to the edge then the plurality of plated through-holes.

In yet another variant, the first surface of the electrical connector is disposed a first distance from the bottom surface and the second surface of the electrical connector is disposed a second distance from the top surface with the first and second distances being unequal.

In a fourth aspect of the invention, a connector assembly is disclosed. In one embodiment, the connector assembly comprises an SFP-type connector and an associated cage.

In a fifth aspect of the invention, a connector assembly cage is disclosed. In one embodiment, the connector assembly cage comprises a multi-slot cage formed from a metallic material.

In a sixth aspect of the invention, a method of operating a connector assembly is disclosed.

In a seventh aspect of the invention, a method of changing the configuration of a connector assembly is disclosed.

BRIEF DESCRIPTION OF THE DRAWINGS

The features, objectives, and advantages of the invention will become more apparent from the detailed description set forth below when taken in conjunction with the drawings, wherein.

Figure 1:
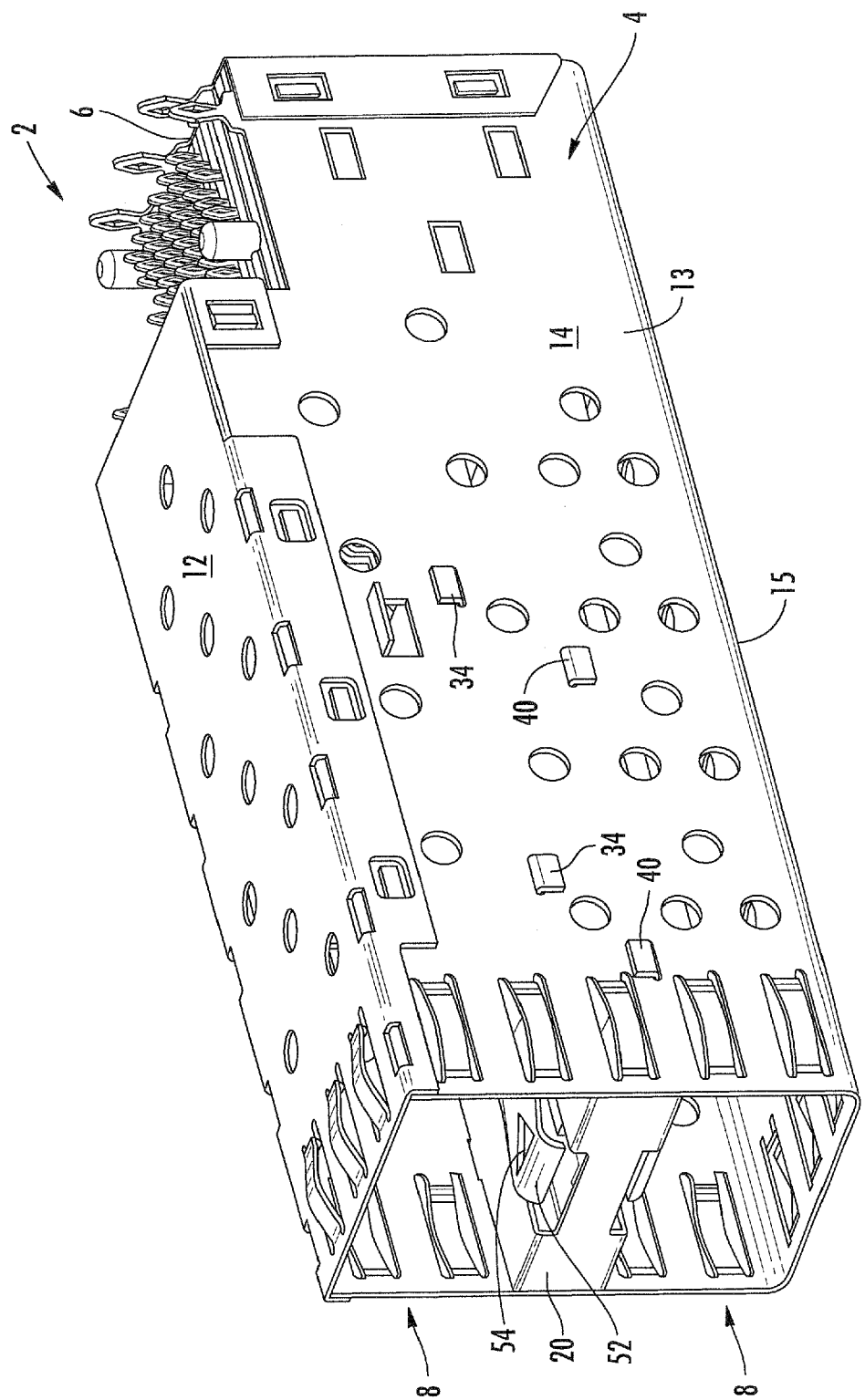
FIG. 1 is a perspective view from an underside of the electrical connector assembly showing both the cage assembly and connector assembly.

All Figures disclosed herein are © Copyright 2006-2007 Pulse Engineering, Inc. All rights reserved.

DETAILED DESCRIPTION OF THE PREFERRED EMBODIMENT

Reference is now made to the drawings wherein like numerals refer to like parts throughout.

As used herein, the term "integrated circuit (IC)" refers to without limitation any type of device, whether single or multiple die, having any level of integration (including without limitation ULSI, VLSI, and LSI) and irrespective of process or base materials (including, without limitation Si, SiGe, CMOS and GaAs). ICs may include, for example, memory devices (e.g., DRAM, SRAM, DDRAM, EEPROM/Flash, ROM), digital processors, SoC devices, FPGAs, ASICs, ADCs, DACs, transceivers, memory controllers, and other devices, as well as any combinations thereof.

As used herein, the term "memory" includes any type of integrated circuit or other storage device adapted for storing digital data including, without limitation, ROM. PROM, EEPROM, DRAM, SDRAM, DDR/2 SDRAM, EDO/FPMS, RLDRAM, SRAM, "flash" memory (e.g., NAND/NOR), and PSRAM.

As used herein, the terms "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

As used herein, the term "signal conditioning" or "conditioning" shall be understood to include, but not be limited to, signal voltage transformation, filtering and noise mitigation, signal splitting, impedance control and correction, current limiting, capacitance control, and time delay.

As used herein, the terms "electrical component" and "electronic component" are used interchangeably and refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

It is noted that while the following description is cast primarily in terms of a single or stacked SFP type connector assembly and associated SFP modules, the present invention may be used in conjunction with any number of different connector types. For example, the present invention may readily be adapted for use in the so-called "SFP+" standard in which SFP+ transceivers are designed for use in high speed serial interconnect applications at speeds up to 10 Gigabits/second.

Further, the principles discussed in this disclosure are recognized by the inventor hereof to be equally applicable to other connector types and/or standards including without limitation the Small Form Factor (SFF); Quad Small Form factor Pluggable transceiver (QSFP); and the 10 Gigabit Small Form Factor Pluggable (XFP) standards. Accordingly, the following discussion of the SFP type connectors and modules is merely illustrative of the broader concepts of the invention.

The present invention may also be combined with other types of technologies and capabilities such as e.g., using one or more integrated circuits within or in conjunction with the connector assembly.

Mechanical Embodiments

Figure 2:
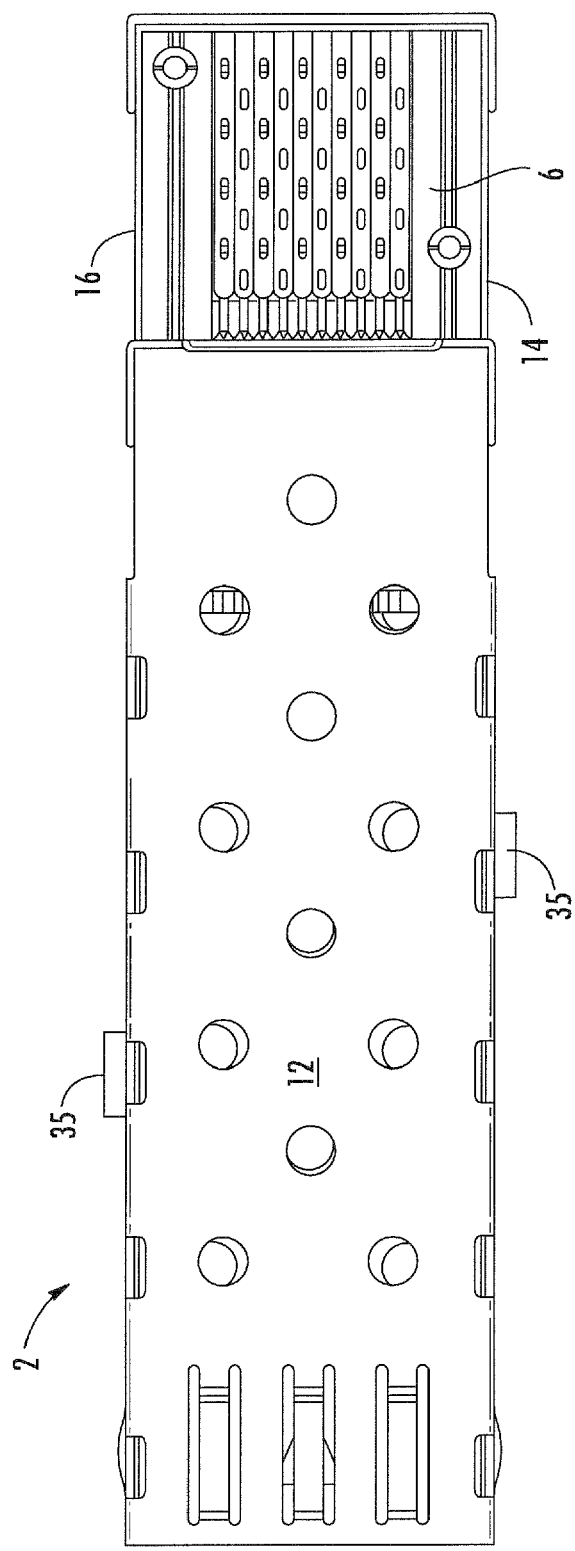
FIG. 2 is a bottom elevational view of the assembly of FIG. 1.

With reference to FIGS. 1 and 2, a first embodiment of an electrical cage and connector assembly manufactured in accordance with the principles of the present invention is shown generally at 2. The electrical assembly 2 comprises a cage assembly 4, and a connector assembly 6 positioned therein. The cage member assembly 4 comprises a stamped and formed metallic structure with various integrated features that enhance the manufacture of the assembly, although it will be appreciated that other materials and configurations may be used consistent with the invention. It should be recognized from FIG. 1 that the connector assembly 2 is intended for placement on an external motherboard (which will be described more fully herein at FIGS. 10 and 11-11B) and includes a plurality of ports 8 for receipt of pluggable modules (not shown), although other placements and configurations may be employed.

The cage member assembly 4 includes a bottom shielded member 12 and a top cage member 13 defined generally by side walls 14 and 16 and top wall 10, with the side walls 14, 16 adjoined to the top wall 10 via sheet metal bends 15. Cage member assembly 4 also includes a separator member 20 secured to the side walls 14, 16 via a plurality of bent tabs 34. The separator member 20 defines the internal boundaries for the plurality of ports 8.

It is noted that the terms "top" and "bottom" and "upper" and "lower" as used herein are not specific to any relative or absolute orientation; i.e., the "top" surface of a device when mounted upside-down may actually comprise the "bottom" surface. Accordingly, these terms are only used for purposes of illustration and convenience, and are no way limiting on the various embodiments of the invention.

Figure 3:
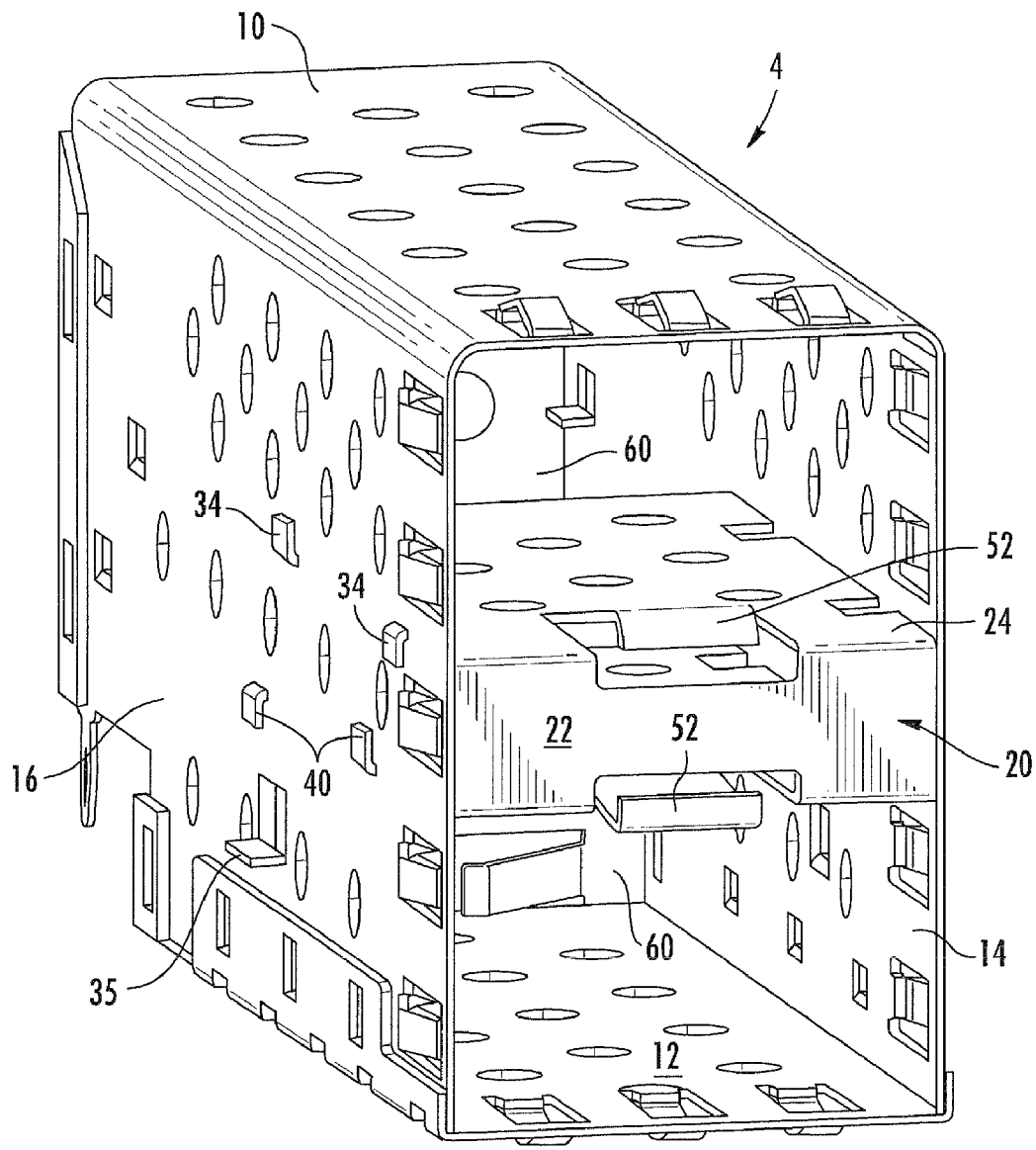
FIG. 3 is a front perspective view of the cage of FIG. 1.
Figure 4:
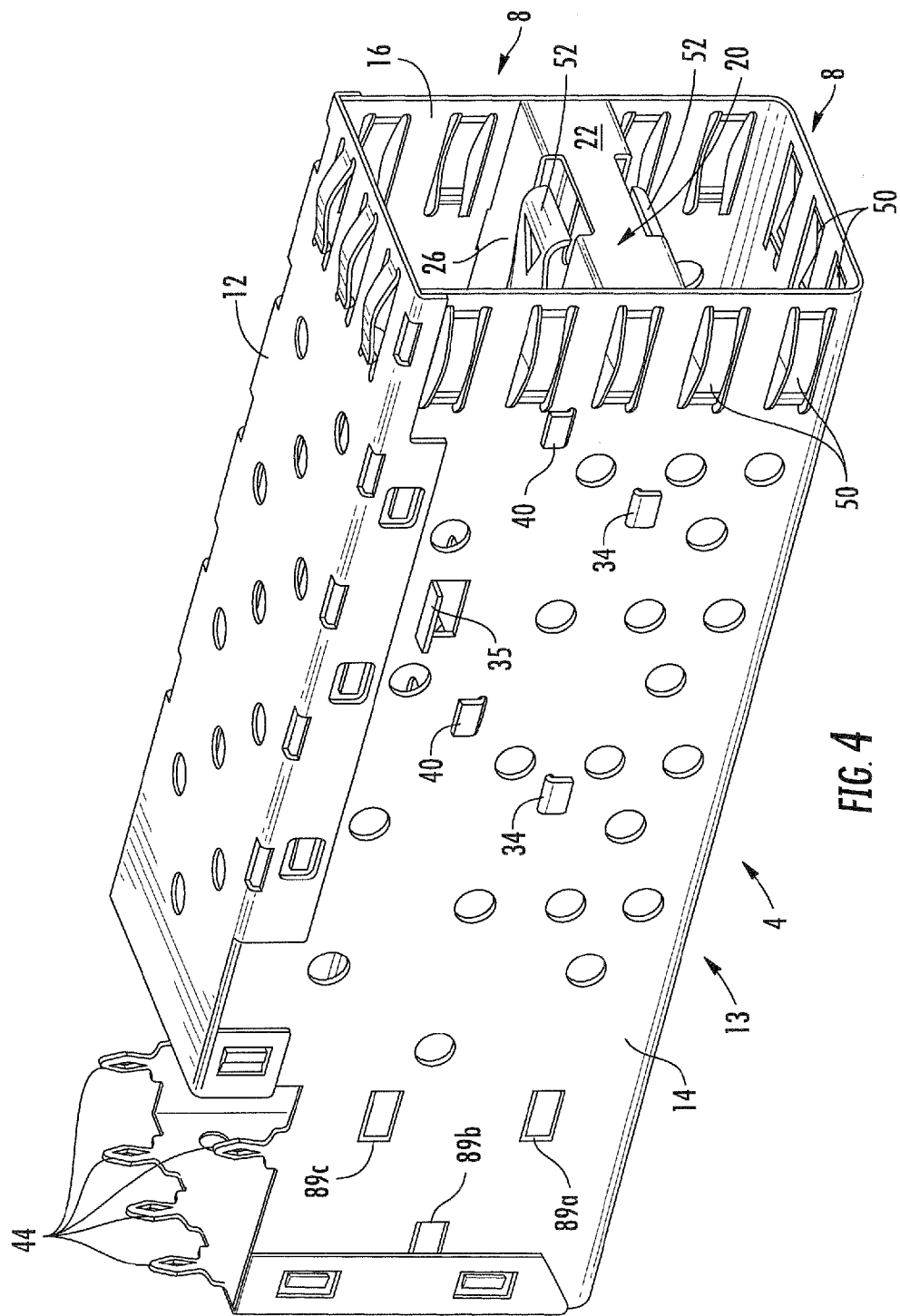
FIG. 4 is an underside perspective view of the cage assembly of FIG. 3.

Referring now to FIGS. 3 and 4, the cage member assembly 4 is shown with the electrical connectors 6 (shown in FIGS. 1 and 2) removed. Again, the cage member assembly 4 is generally comprised of a top wall 10, a lower wall member 12, and side walls 14 and 16, which together define the overall enclosure for cage member assembly 4. As previously discussed, the illustrated cage member assembly 4 is subdivided into rows by way of a center separator member 20, having a front face portion at 22 with an upper wall 24 (FIG. 3) and a lower wall 26 (FIG. 4). It will be appreciated that the center separator member 20 is retained in place by the tabs 34 and 40, which extend from side edges of the upper and lower walls 24, 26, and which extend through the side walls 14, 16 of the top cage member 13, as best shown in FIGS. 1 and 3. However, other methods including surface mounted soldering techniques, locator features (i.e. bumps and the like) may be substituted with equal effectiveness.

The cage member assembly 4 has numerous features allowing the grounding of the cage assembly to a motherboard and/or a panel. As perhaps is shown best in FIG. 4, the end perimeter of the cage assembly 4 includes a plurality of printed circuit board tines 44, which are configured to both mechanically hold the cage assembly 4 to a motherboard as well as to ground the cage assembly 4 thereto. Around the perimeter of the cage assembly 4 towards the front edge thereof (i.e. the end of the cage assembly 4 where the two (2) ports 8 of the cage assembly 4 are located), the cage member assembly 4 includes a plurality of EMI tabs 50, which are profiled to engage an edge of an opening in an electrical panel through which the cage assembly 4 is inserted. The walls 24 and 26 of separator member 20 include grounding tabs 52 adjacent a front edge thereof for grounding the internally mounted module (not shown for purposes of clarity) that is to be inserted therein.

Referring now back to FIG. 3, the cage member assembly 4 also includes a communication opening 60 which is formed by an opening extending through lower shield member 12 (FIG. 4C), and through the divider wall 24 located on separator member 20 (FIG. 4B), and through a corresponding opening similar to opening, which extends through wall 26 of separator member 20. The communication opening 60 extends through lower shield member 12 and through intermediate walls 24, 26 of separator member 20 at the rearward side thereof for access to connector assembly 6.

Figure 4A:
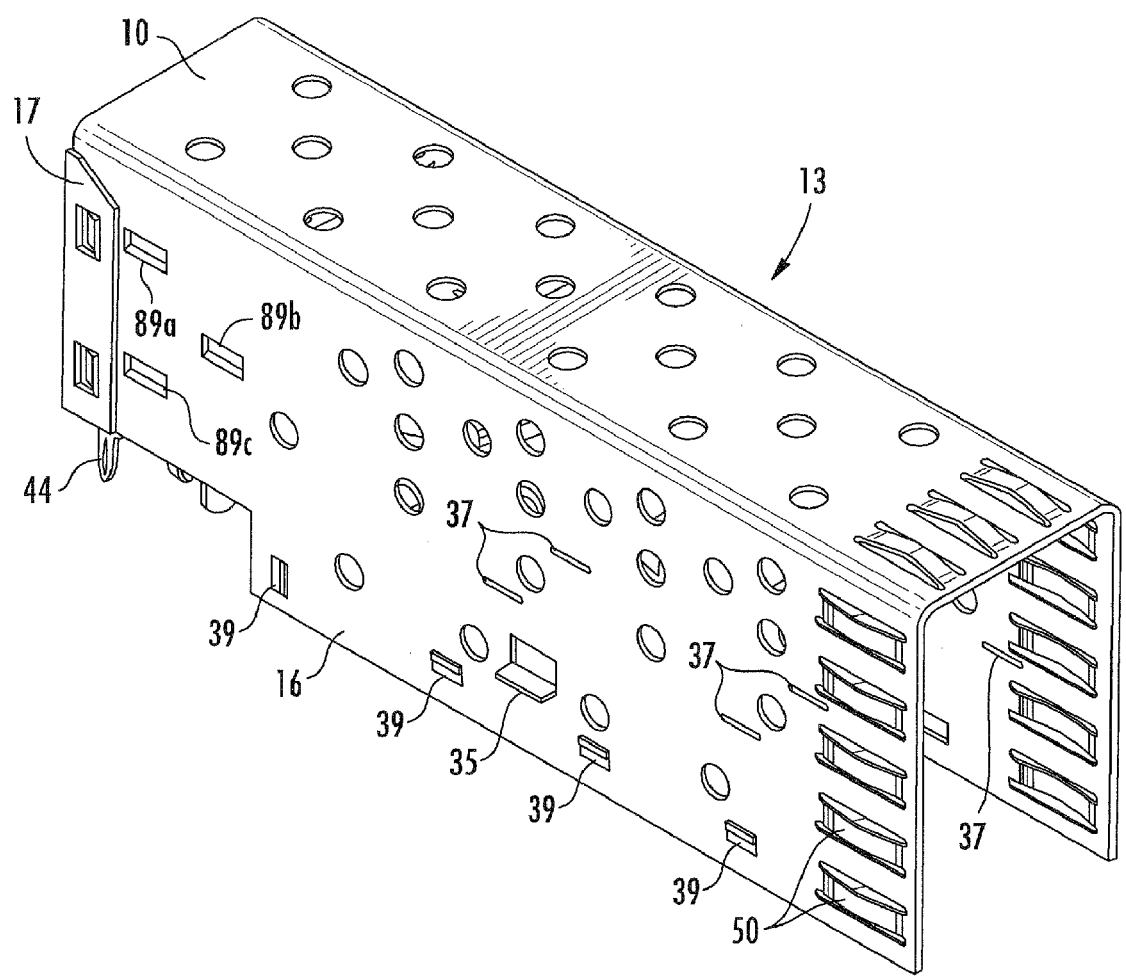
FIG. 4A is a front perspective view of the top cage member shown in FIGS. 3 and 4.

Referring now to FIG. 4A, the top cage member 13 is shown and described in detail. The top cage member 13 comprises two side walls 14, 16, a top wall 10 and a fold-down back wall 17. The top cage member 13 is preferably formed from a single sheet of a metallic base material that is subsequently stamped and formed. The side walls 14, 16 possess a plurality of features that facilitate the assembly of the top cage member 13 with other components to form the connector assembly 2 of FIG. 1. For instance, alignment features 89 are utilized to align the top cage member 13 with the connector 6. These alignment features 89 will be discussed more fully below with reference to FIG. 7.

A plurality of louver features 39 are formed (e.g., stamped) into the bottom periphery of top cage member 13 and are adapted to mate with respective features 43 on the bottom cage member 12 (FIG. 4C), thereby permitting quick assembly of the bottom cage member 12 with the top cage member 13. Additional operations (e.g. soldering, conductive epoxy and the like) can be added at the interface between the louver features 39 and their mating features 43 so as to enhance electrical and mechanical connectivity between the two components. External tabs 35 are adapted to provide mechanical/electrical connectivity between the front portion of the top cage member 13 and an external printed circuit board. Because the low profile nature of the connector assembly 2 requires that the connector assembly 2 reside in a cut out located on the external printed circuit board (see e.g. FIGS. 10 and 11A), the external tabs 35 offer support for the front portion of the connector assembly 2. As previously discussed, the EMI tabs 50 are positioned around the front periphery of top cage member 13 and are adapted to mount with a respective opening on an external panel (not shown), thereby providing extra grounding connectivity between the connector assembly 2 and the external panel. A plurality of separator member receiving slots 37 are adapted to receive respective tabs 34, 40 (See FIG. 4B) on the separator member 20. The printed circuit board tines 44 are adapted to be fed through respective holes on a printed circuit board and then optionally soldered.

Figure 4B:
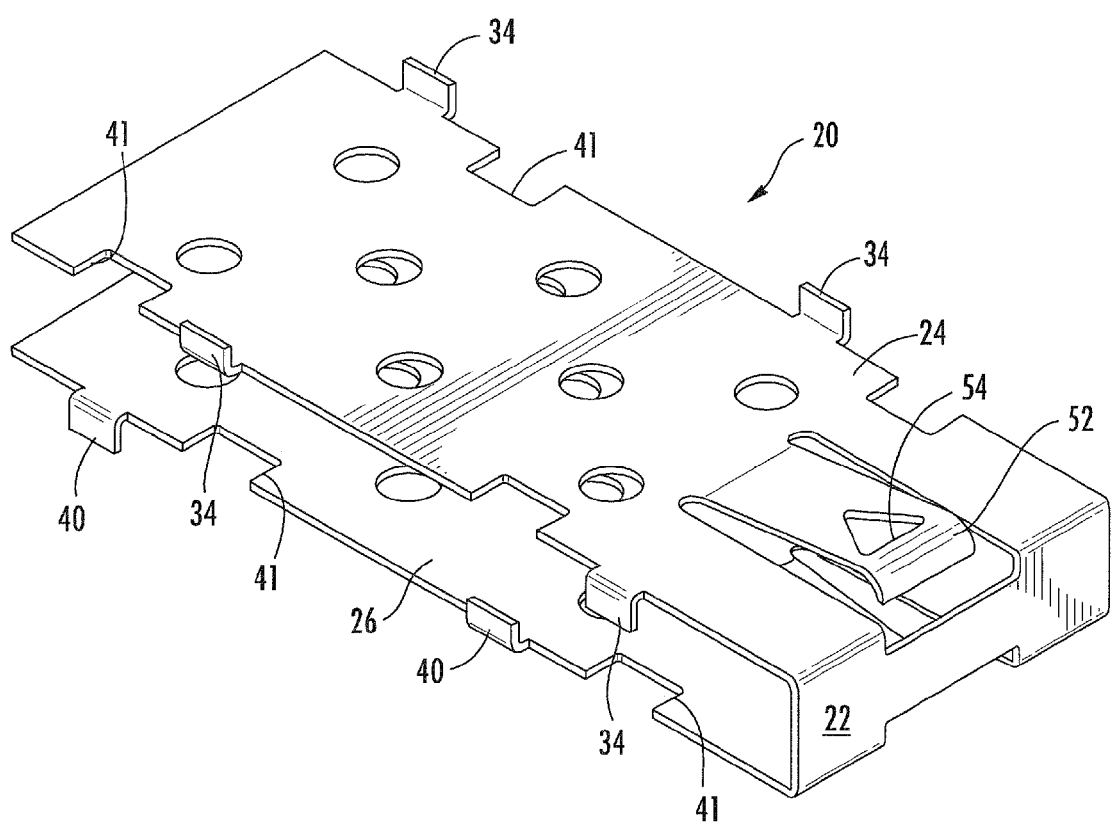
FIG. 4B is a front perspective view of the separator cage member attachable to the top cage member shown in FIGS. 3 and 4.

Referring now to FIG. 4B, the separator member 20 of the connector assembly 2 is shown and described in detail. The separator member 20 comprises top 24 and bottom walls 26 and a front wall 22. The walls 24 and 26 include grounding tabs 52 adjacent a front edge thereof for grounding the internally mounted module to be inserted therein as well as latch opening 54 which aid in module removal. As previously discussed with reference to FIG. 4A above, the separator member 20 comprises a plurality of upper tabs 34 and lower tabs 40 that are adapted to connect the separator member 20 to the top cage member 13. These tabs 34, 40 may optionally be secured (via a eutectic solder, conductive epoxy and the like) to enhance the electrical performance of the cage assembly 4. A plurality of slots 41 are also located on the top and bottom walls 24, 26 of the separator member 20. These slots 41 are preserved for 2×N SFP embodiments when two (2) of the separator members are adjacent to one another. These slots 41 are adapted to accommodate the tabs 34, 40 from adjacent separator members 20 in 2×N embodiments.

Figure 4C:
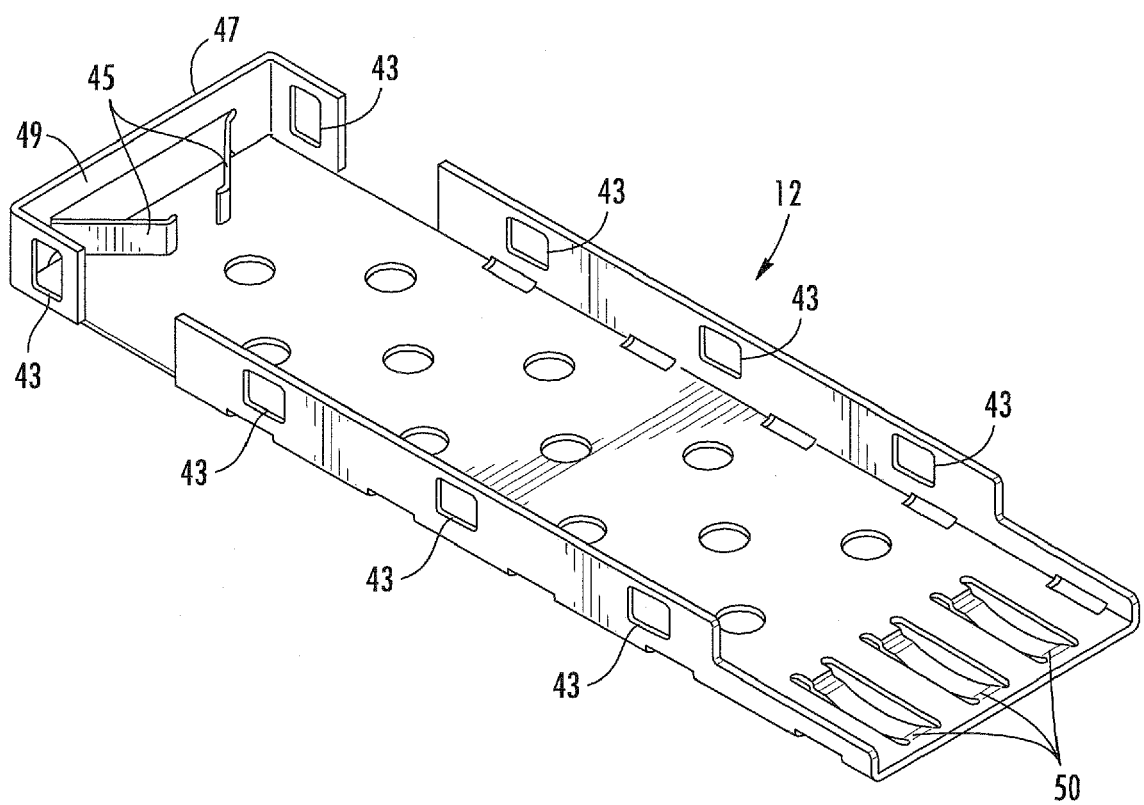
FIG. 4C is a front perspective view of the bottom cage member attachable to the top cage member shown in FIGS. 3 and 4.

Referring now to FIG. 4C, the bottom shield member 12 of the cage assembly 4 is shown and described in detail. The bottom shield member 12 comprises a plurality of latching features 43 which are adapted to interface with respective louver features 39 located on the top shield member 13 (see FIG. 4A). On the back wall 47 of bottom section 12 resides a plurality of EMI tabs 45. These EMI tabs 45 serve two (2) main purposes. The first of which is to interact with the plugged transceiver module and provide grounding to the module to improve the EMI performance of the assembly (such as the assembly 2 shown in FIG. 1). A second purpose of the EMI tabs 45 is to facilitate the ejection of the pluggable modules after insertion. Specifically, the EMI tabs 45 act as springs in the illustrated embodiment which can facilitate extraction of the pluggable modules when desired. The back wall 49 acts as a stop for the pluggable modules when inserted. As the back wall 49 incorporates clearance for the EMI tabs 45, the pluggable modules when fully inserted will rest against the back wall 49, thereby preventing over (and under) insertion of the pluggable modules. This feature is not found in prior art SFP-type connector modules. The bottom shield member 12 also comprises a plurality of EMI tabs 50, similar to those on top shield member 13, at the front end of the bottom shield member 12 so that the periphery of the connector assembly ports 8 possess a plurality of EMI tabs 50.

Figure 5:
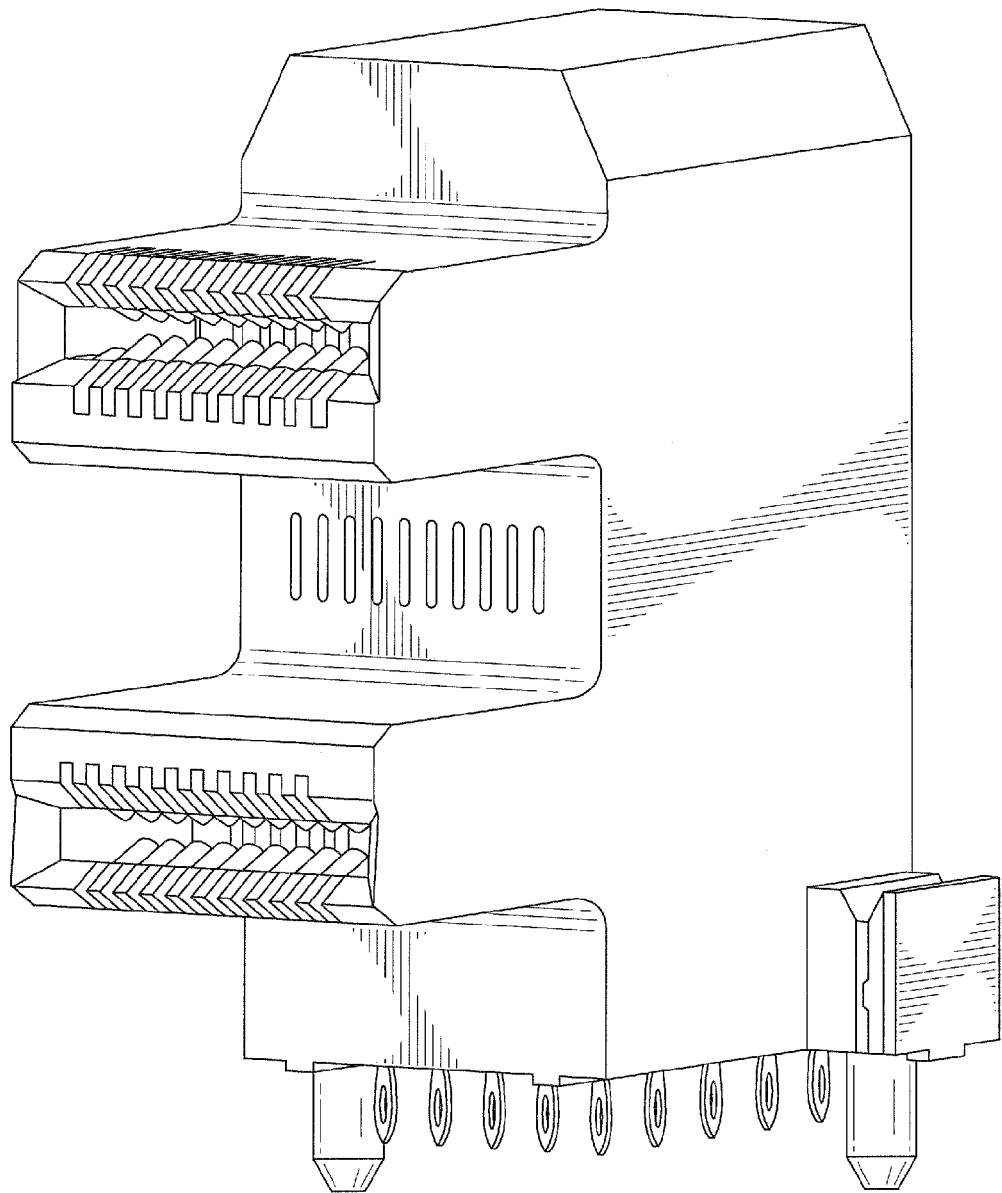
FIG. 5 is a perspective view of a prior art connector.

FIG. 5 illustrates a typical prior art connector, shown primarily to illustrate the various improvements made to the low-profile connector 6 shown and discussed subsequently herein with respect to FIG. 6.

Figure 6:
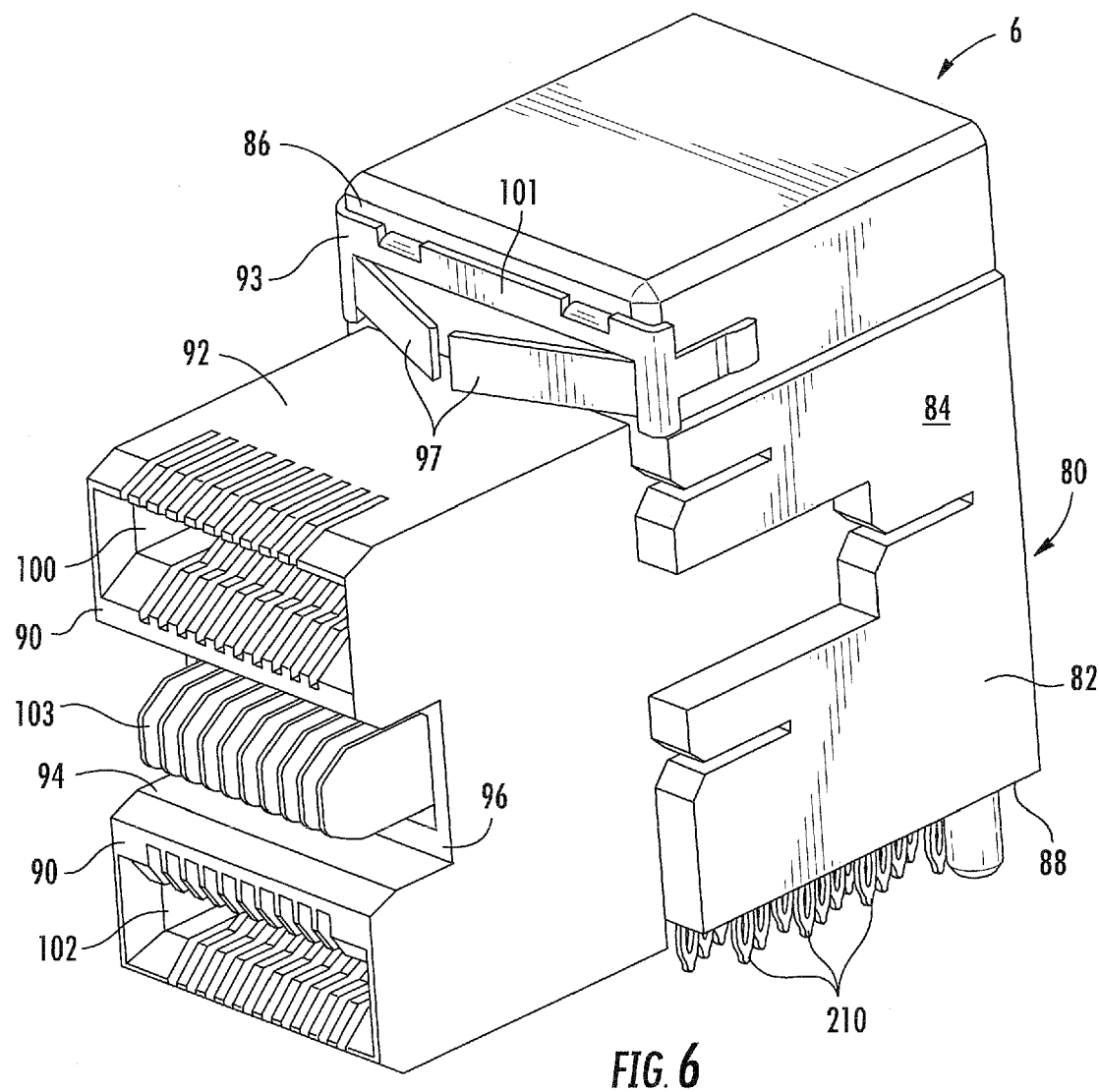
FIG. 6 is a perspective view of the connector assembly shown in FIG. 1.

The exemplary housing 80 and low profile connector 6 of FIG. 6 is now described in detail. As shown in FIG. 6, the present embodiment of the low profile connector 6 comprises housing 80, which is defined by a body portion 82 and defined by side walls 84, 86, a lower face 88 for receipt on an external printed circuit board, and a mating front face at 90. The upper and lower extension portions 92 and 94 extend from the body portion 82 and define the mating face 90 for the insertable modules. A recessed portion 96 is defined between the upper and lower extensions 92, 94 at the front face of the body portion 82. The recessed portion 96 comprises a plurality of retention features 103, which act to secure the terminal modules 140 within the housing 80. While some of the aforementioned structural features generally correlate to the structure of a prior art connector as shown in FIG. 5; several noteworthy distinctions are now discussed in detail.

First, lower face 88 is now resident in close proximity with the bottom surface of the lower extension portion 94. Such a configuration increases port density by lowering the overall height of the connector 6 thereby contributing to the overall low profile character of the connector 6. The situation of the cage/connector assembly 2 will be discussed further herein with regards to FIGS. 10-11B. Contrast this feature with the prior art connector shown in FIG. 5; the prior art connector does not maintain a lower face that resides in close proximity with the bottom surface of the lower extension portion, but rather must remain offset in order to accommodate the inserted modules. It should also be noted that modifications to the internal leadframe structure of the connector 6 were also made to accommodate the low profile connector 6 of FIG. 6. It is also believed that this modified internal leadframe structure offers improved electrical performance over the prior art connector due to the shortened signal paths between the interface between the modules (i.e. the printed circuit board receiving slots 100, 102) and the external printed circuit board attached to terminals 210.

Figure 6A:
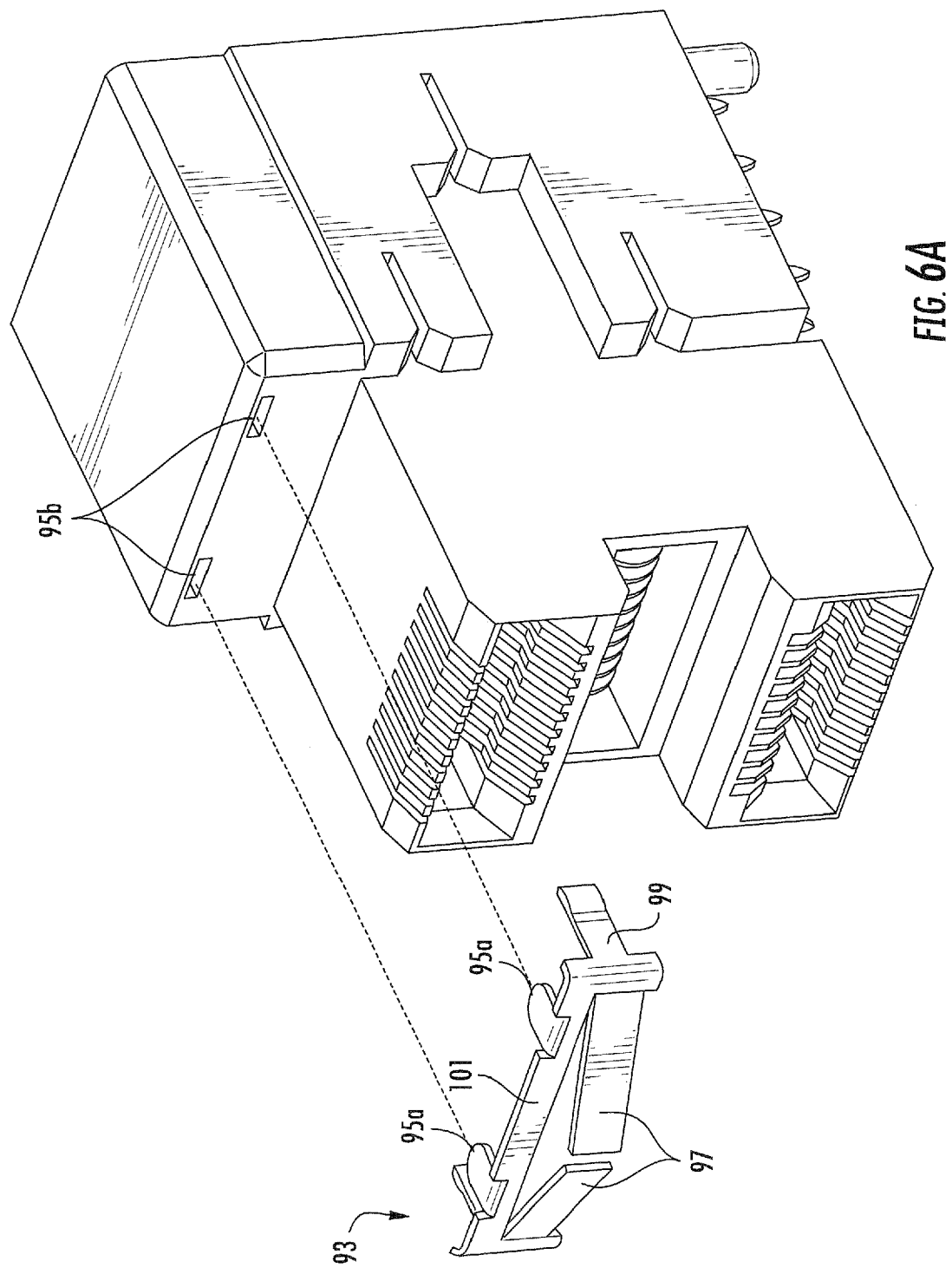
FIG. 6A is an exploded perspective view of the connector assembly shown in FIG. 6.

Referring now to FIG. 6A, a plurality of EMI receiving slots 95b are incorporated into an upper portion of the housing 80 of the low-profile connector 6. These EMI receiving slots 95b are adapted to accept respective tabs 95a from an EMI mating shield 93. The EMI mating shield 93 comprises a front face 101 having a pair of spring tabs 97 protruding therefrom. The spring tabs 97 operate in a similar manner to the EMI tabs 45 discussed with reference to FIG. 4C. The side tabs 99 of the EMI mating shield 93 are adapted to engage the cage shield 4 discussed previously.

Also noteworthy is the modularity of the EMI mating shield 93. While the current embodiment shows an EMI mating shield 93 adapted for use in a stacked 2×1 SFP connector assembly, because the EMI mating shield 93 is made from a separate stamping from the cage assembly 4, it can readily be included in a 2×N SFP connector or a single SFP connector assembly as well.

Figure 7:
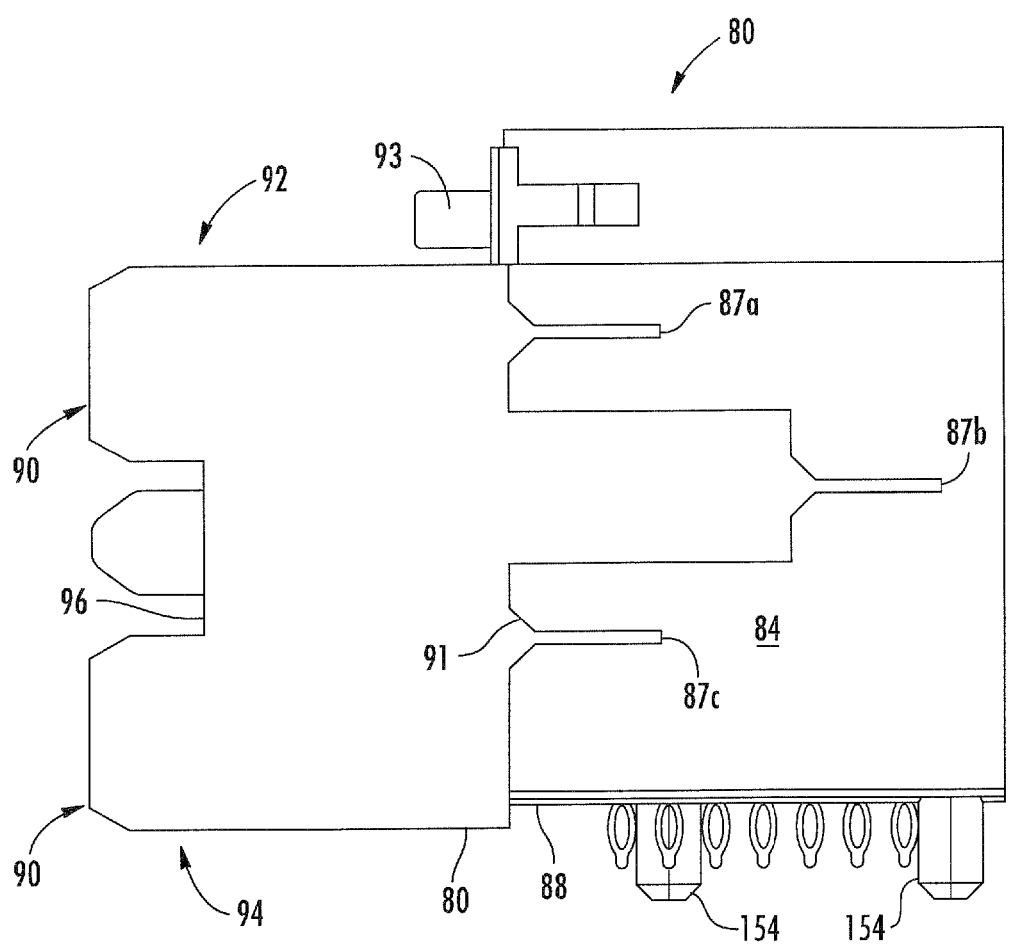
FIG. 7 is a side elevational view of the connector shown in FIGS. 6 and 6A.

Referring now to FIG. 7, other advantageous features of the connector 6 are shown and described in detail. Specifically, a plurality of alignment slots 87 are illustrated on the housing 80 of the connector 6. These alignment slots 87 are located on the side walls 84 of the connector housing 80. These slots 87 each comprise chamfered inlets 91 in the present embodiment, and are adapted to interface with respective alignment features 89 located on the side walls 14, 16 of the cage member 4 (See e.g. FIG. 4). These slots 87 provide a distinct improvement over prior art devices in that they ensure proper alignment between the cage member 4 and the connector housing 80, thereby ensuring proper alignment for inserted modules into the cage member ports 8 and their subsequent connection with respective printed circuit board receiving slots 100, 102. These features have been found to be particularly important in 2×N embodiments in which the additive effects of improper alignment for the inserted modules may be magnified. However, these alignment slots 87 have proven useful in 1×1 and 2×1 connector embodiments as well.

Figure 8:
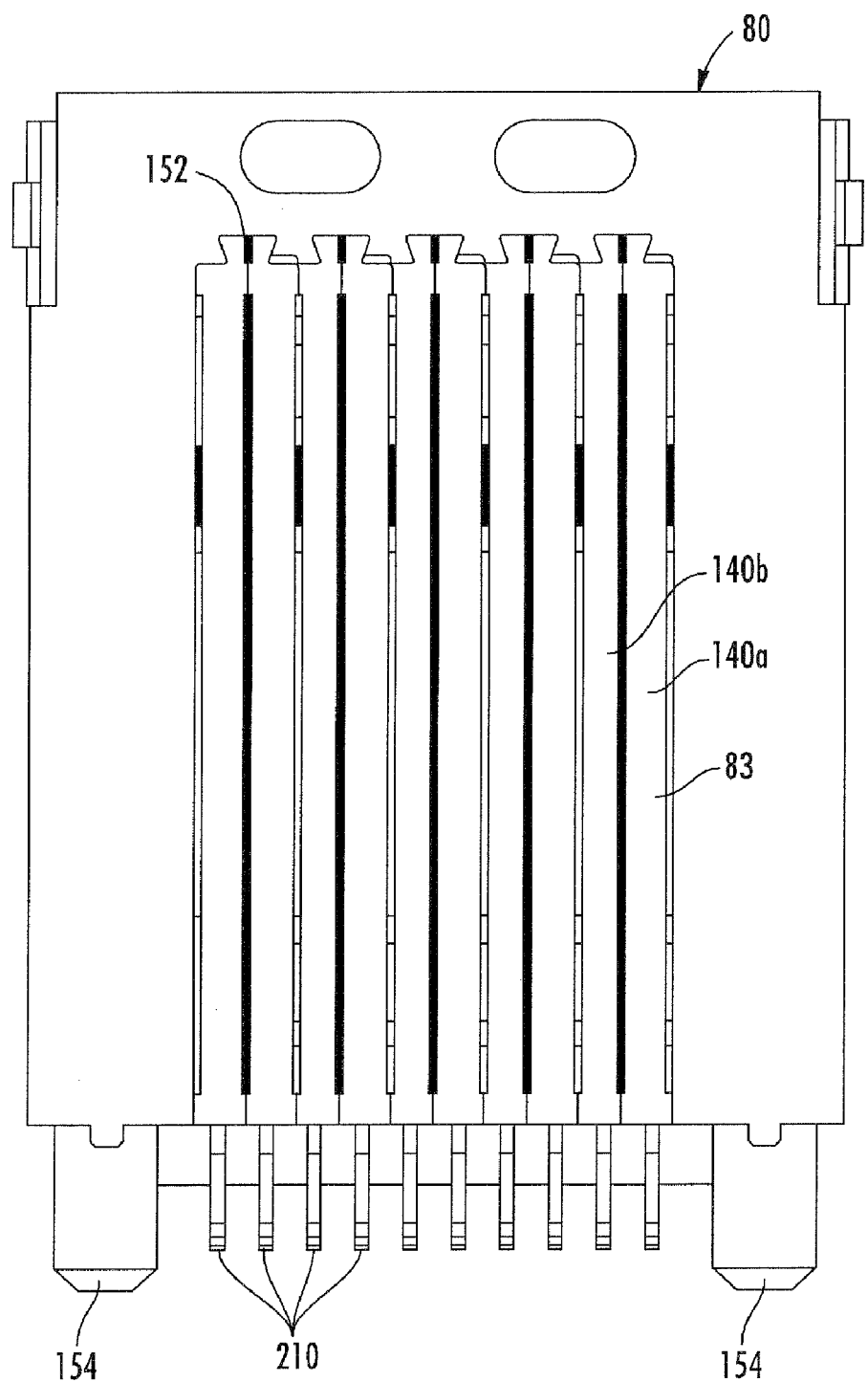
FIG. 8 is a back elevational view of the connector assembly shown in FIGS. 6 and 6A.
Figure 9:
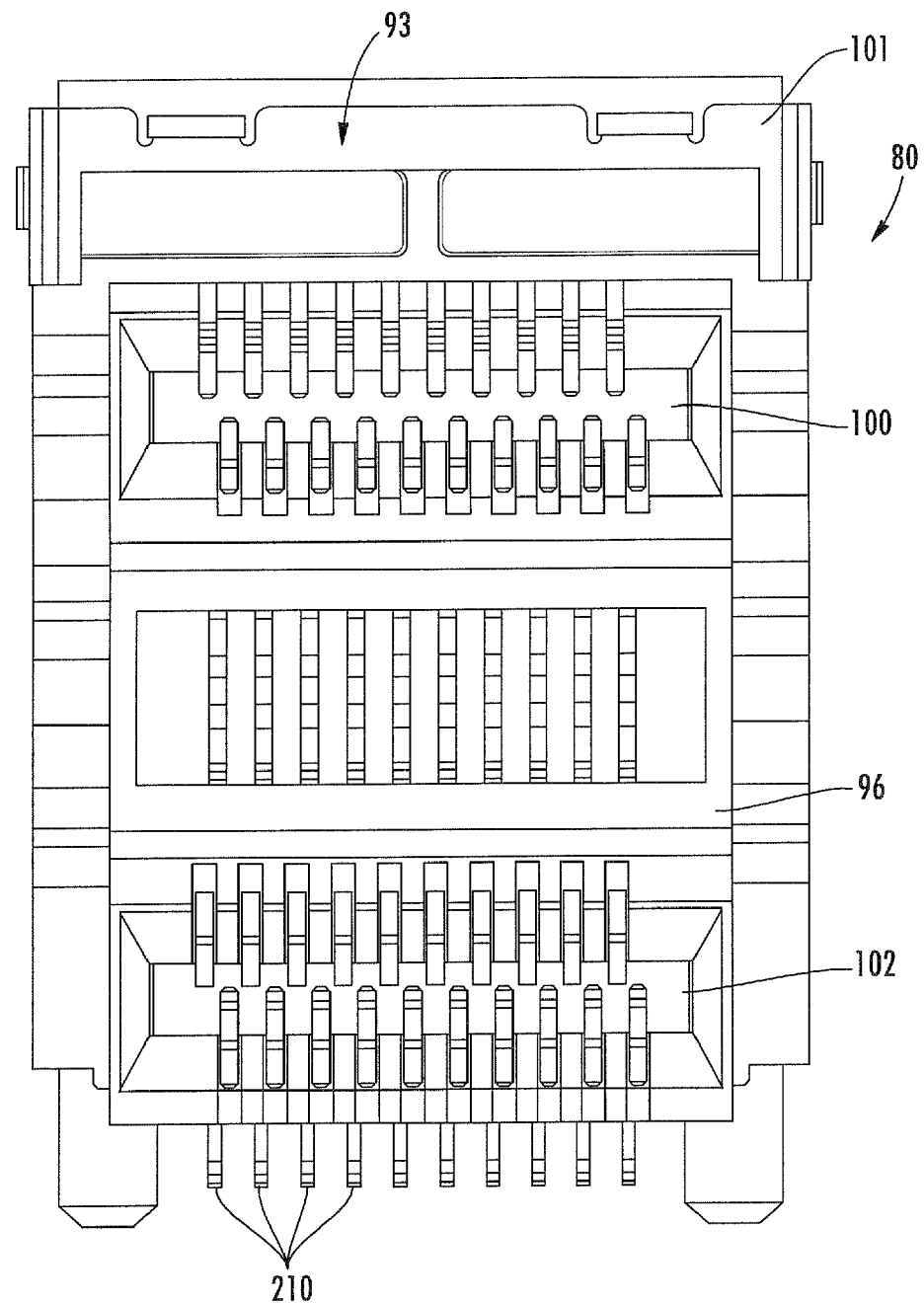
FIG. 9 is a front elevational view of the connector assembly of FIGS. 6 and 6A.

With reference now to FIGS. 8 through 9, other portions of housing 80 are shown and described in greater detail. The backside cavity 83 is shown in greater detail in FIG. 8. It will be appreciated that this cavity 83 is defined for the receipt of terminal modules 140 which comprise, in one embodiment, a leadframe 210 housed in an insulative housing. These modules 140 interface with the external printed circuit board via their leadframe terminals 210. FIG. 8 also illustrates that housing 80 includes a plurality of dove-tail slots 152 positioned within the housing 80. The connector housing 80 also includes aligning posts 154 that serve to mechanically align and support the housing 80 on the external printed circuit board.

As shown in FIG. 9, circuit card receiving slots 100 and 102 extend inwardly from front faces 90 of each of the respective upper and lower extensions 92, 94, and extend inwardly to the housing body 80. These circuit card receiving slots 100, 102 provide terminations between the inserted modules and their respective terminal pins 210.

Figure 10:
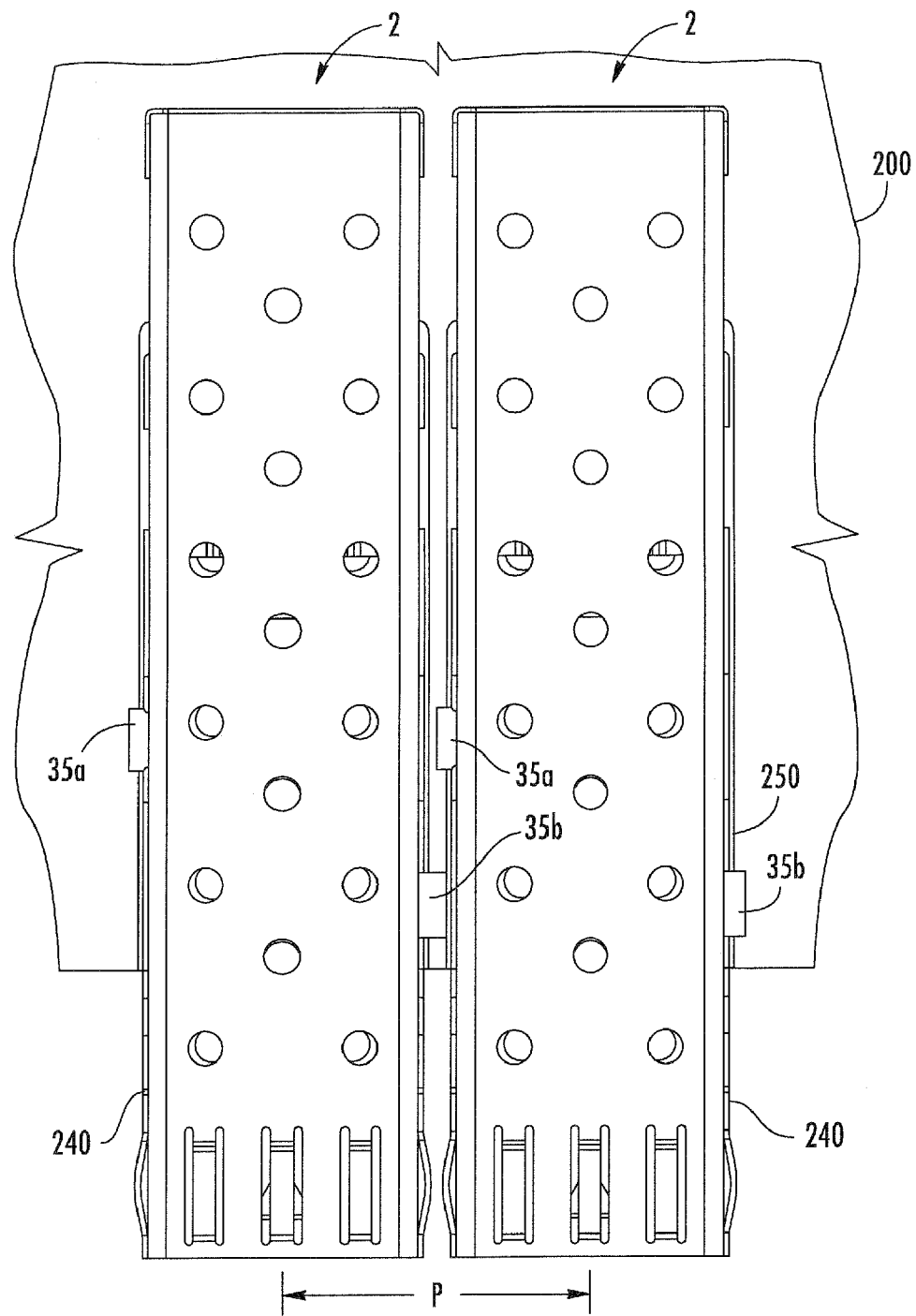
FIG. 10 is a top elevational view showing two connector assemblies mounted in a side by side array on a printed circuit board.

Referring now to FIG. 10, one salient advantage of the cage/connector assembly 2 of the present invention is shown and described in greater detail. Specifically, FIG. 10 details two (2) cage/connector assemblies 2 placed adjacent to one another on an external printed circuit board 200. The low profile nature of the cage/connector assembly 2 necessitates that a large portion of the assembly reside within cutouts 250 located on the printed circuit board 200. Because the forward portion 240 of the connector assemblies 2 are no longer supported on their bottom face 12 on the printed circuit board 200 (as was the case in prior art designs discussed later), the connectors 2 need to be supported by external tabs 35 which act to both mechanically secure the front portion 240 of the connector assembly 2 to the printed circuit board 200 and also act as additional ground tabs to the printed circuit board 200. Note also that the external tabs 35a are offset from the external tabs 35b, thereby allowing the connector assemblies 2 to be placed in close proximity to one another. The connector assemblies 2 can thus be separated by a closer or smaller pitch "P" than otherwise possible if these external tabs 35 were not offset from one another.

Figure 11:
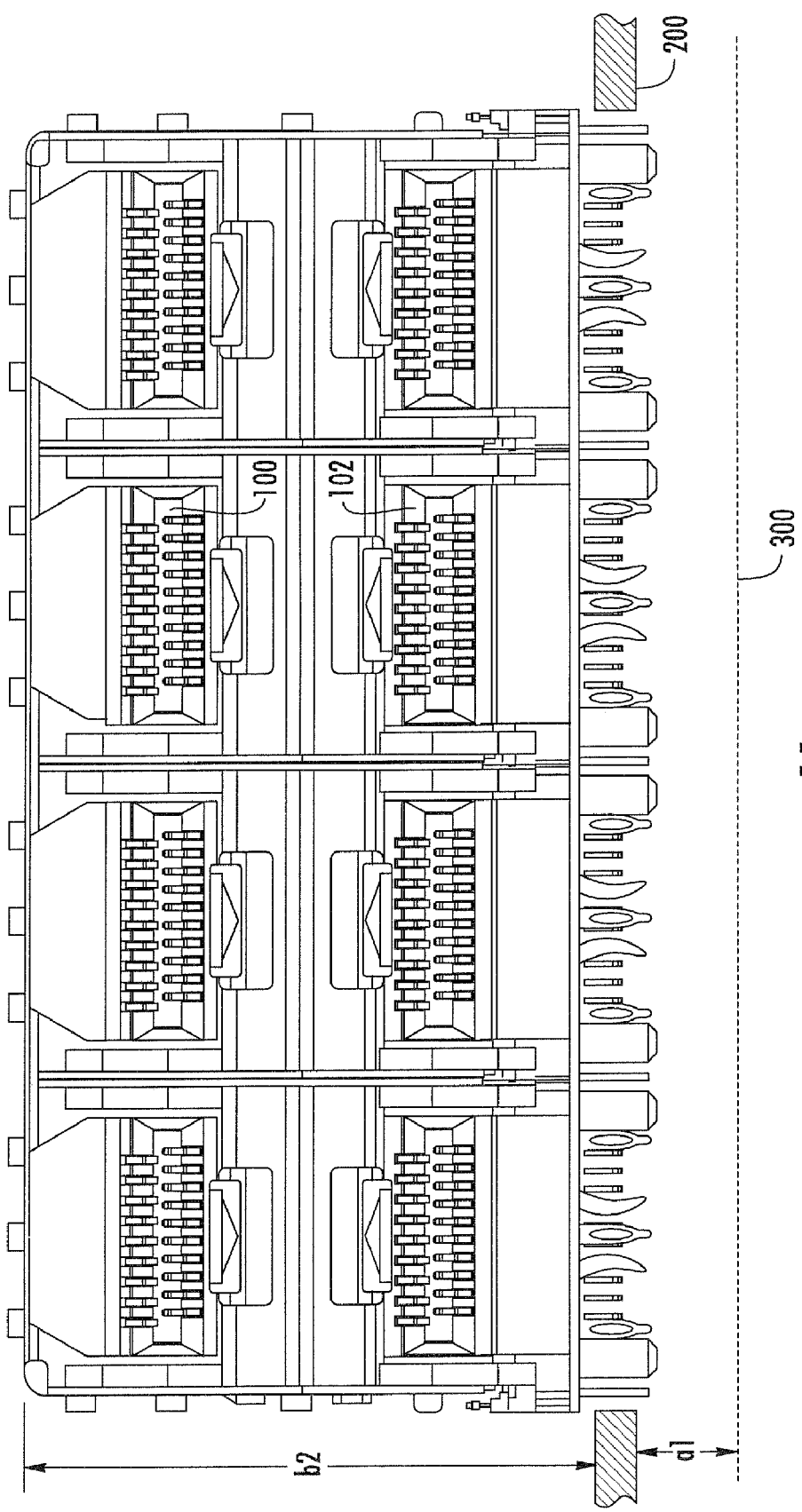
FIG. 11 is a front elevational view of a prior art connector assembly mounted on a printed circuit board.

Referring now to FIG. 11, a prior art 2×N SFP connector assembly is shown mounted on an external printed circuit board 200. As can be seen from FIG. 11, prior art SFP connector assemblies protruded above printed circuit board 200 by a first distance ("b2"). However, prior art enclosures that encase the SFP connector assemblies often have a first wasted distance ("a1") between the bottom surface of the printed circuit board 200 and the bottom internal surface 300 of the enclosure.

Figure 11A:
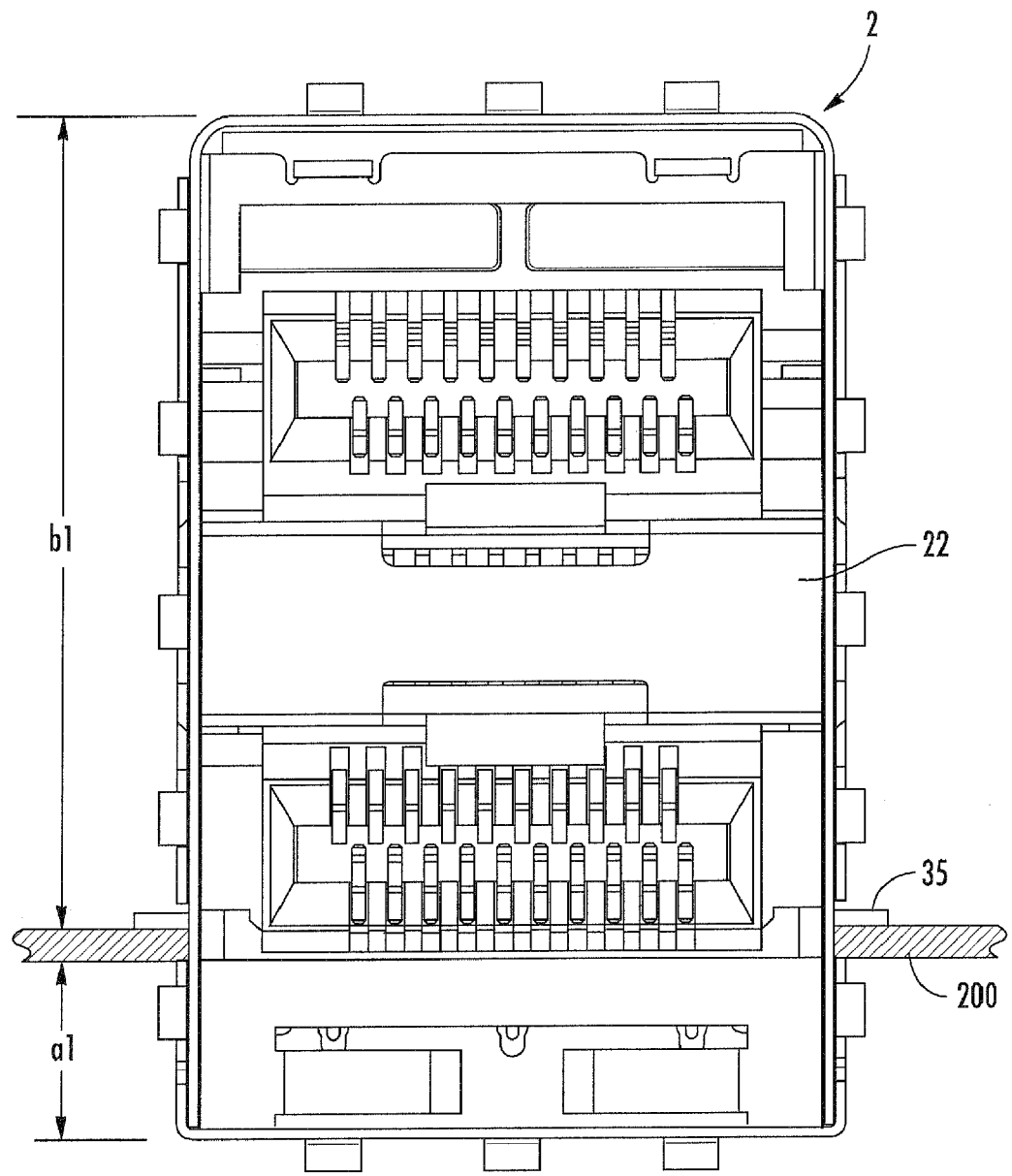
FIG. 11A is a front elevational view of the connector assembly of FIG. 1 mounted on a printed circuit board.

FIG. 11A illustrates the advantages of the low profile connector assembly 2 according to one embodiment of the present invention. It was recognized that the aforementioned wasted space ("a1") could be utilized by the connector assembly 2, thereby lowering the overall height of the enclosure. As can be seen, the connector assembly 2 resides on the external printed circuit board 200 via, inter alia, external tabs 35. The bottom portion of the connector assembly 2 thus occupies this otherwise unused space in the enclosure (not shown). Therefore the amount of space occupied by the connector assembly 2 above the printed circuit board 200 now is a second dimension ("b1"). Hence, the overall height of the enclosure (not shown) can be reduced as dimension "b1" is substantially less tall then dimension "b2" illustrated in the prior art design of FIG. 11.

Figure 11B:
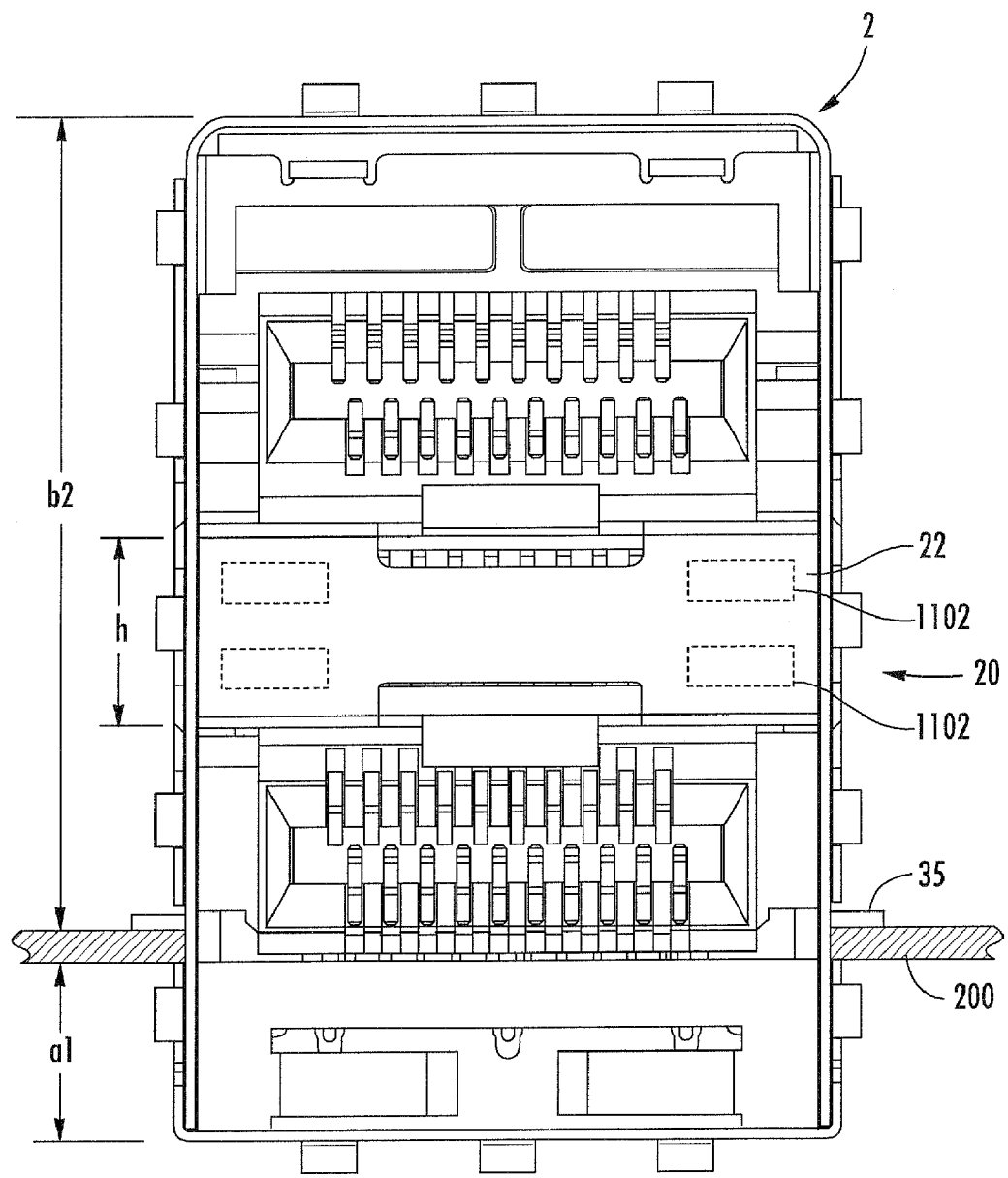
FIG. 11B is a front elevational view of a connector assembly embodiment further comprising a plurality of light sources indicative of a connector port status.

Alternatively, as seen in FIG. 11B, the top half of the connector assembly 2 can be expanded so that its height above the printed board 200 resides at a height of b2 (identical to that height shown in the prior art connector of FIG. 11). This height can be accomplished by expanding the height "h" of the front face 22 of the separator member 20 of the connector assembly 2. Optional light sources 1102 can then be incorporated into the front face 22 of the separator member 20 so that the connector assembly 2 can have indicator lights indicative of the status of the individual ports of the connector assembly 2. The light sources 1102 will in one embodiment comprise light emitting diodes (LEDs) ubiquitous in the electronic arts.

Methods of Manufacture

Methods of manufacturing of the exemplary embodiment of the connector assembly 2 discussed above are now described in detail.

Figure 12:
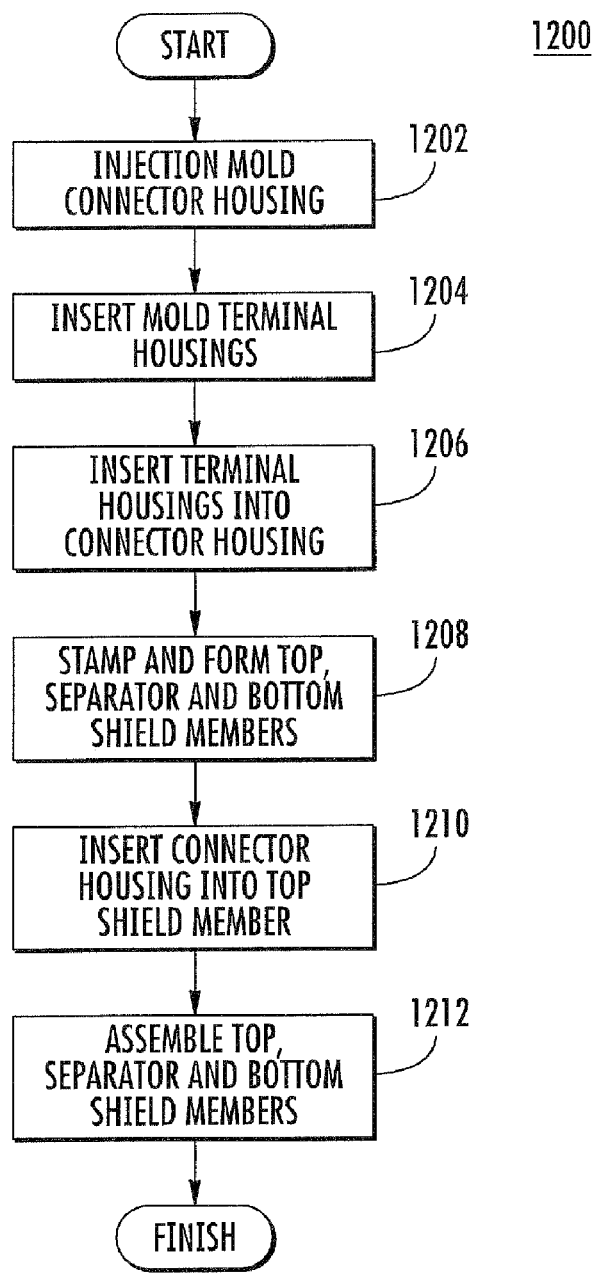
FIG. 12 is a logical flow diagram illustrating a first exemplary method for manufacturing the electrical connector assembly of FIG. 1.

Referring now to FIG. 12, a first exemplary method 1200 for manufacturing the connector assembly 2 of FIG. 1 is shown and described. At step 1202, the connector housing 80 is formed using standard manufacturing techniques. In one embodiment, the connector housing 80 is formed via standard injection molding processes, although other processes such as transfer molding may be used as well. The connector housing 80 is formed from either a thermoset or thermoplastic polymeric material.

At step 1204, the terminal housings 140 utilized within the connector housing 80 are formed. The metallic leads 210 of the terminal housings 140 are stamped from metallic sheets. The metallic sheets comprise copper or a copper based alloy and are subsequently plated with a nickel and/or tin-based plating. The insulative part of the terminal housings 140 are then formed around the metallic leads 210 via standard insert-molding processes well-known in the connector arts. The insulative portions of the terminal housings 140 are formed from a thermoset or thermoplastic polymeric material.

At step 1206, the formed terminal housings 140 are inserted into the connector housing 80. In the connector embodiment of FIG. 1, ten (10) terminal housings 140 are inserted into a single connector housing 80 (see e.g. FIG. 7). The terminal housings 140 are secured inside the connector housing via a press-fit or alternatively may be secured using other known manufacturing processes (i.e. heat staking, adhesives, mechanical snaps and the like).

At step 1208, the top 13, separator 20 and bottom shield members 12 are formed from metallic sheets. The metallic sheets will advantageously comprise copper or a copper based alloy that are subsequently plated with a nickel and/or tin-based plating. Alternatively, the shield members may be formed from metallic base materials that do not require additional plating such as tin-plated steels or nickel-silver alloys. The shield members will also advantageously be formed and stamped using a progressive stamping process thereby further minimizing manufacturing costs.

At step 1210, the connector housing 80 (with the terminal housings 140 inserted) are inserted into the top shield member 13. Recall from our discussion at FIG. 7, that alignment slots 87 are used on the housing 80 to align the connector housing 80 with respective features 89 located on the top shield member 13.

At step 1212, the top 13, separator 20 and bottom shield members 12 are assembled together and held together using mechanical features (i.e. snaps, formed tabs and the like). Additionally, a eutectic solder may be utilized to further strengthen the mechanical (and electrical) connections between the respective shield members.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. An electrical connector mountable on a printed circuit board, comprising:
   an insulative housing having an upper and a lower printed circuit card receiving slot and further comprising a lower surface, said lower surface having a plurality of terminals protruding therefrom; and
   a shield member assembly at least partly enclosing said insulative housing, said shield member assembly comprising a top surface and a bottom surface and further comprising a plurality of tabs, said plurality of tabs residing substantially in plane with said lower surface of said insulative housing; and
   wherein said top surface of said shield member assembly resides above the level said printed circuit board and said bottom surface of said shield member assembly resides below the level said printed circuit board and said lower surface of said insulative housing residing between the levels of said top and bottom surfaces of said shield member assembly.

2. The electrical connector of claim 1, wherein said plurality of tabs comprises at least a first and a second tab, wherein the distance between a front surface of said shield member assembly and said first and said second tabs differs.

3. The electrical connector of claim 1, further comprising an ejection shield, said ejection shield resident within at least one of an upper or a lower transceiver receiving slot of said shield member assembly.

4. The electrical connector of claim 3, wherein at least a portion of said ejection shield is received within said insulative housing.

5. The electrical connector of claim 1, wherein said insulative housing further comprises a plurality of alignment slots and said shield member assembly comprises a plurality of alignment features, said plurality of alignment features adapted to be received within respective ones of said plurality of alignment slots.

6. The electrical connector of claim 5, wherein said plurality of alignment features comprises at least two alignment features on a side surface of said insulative housing, wherein said at least two alignment features are resident on two different planes between the levels of said top and bottom surfaces of said shield member assembly, respectively.

7. An electrical connector mountable on a printed circuit board, comprising:
an insulative housing having an upper and a lower printed circuit card receiving slot; and
a shield member assembly at least partly enclosing said insulative housing, said shield member assembly comprising a top surface and a bottom surface; and
wherein said top surface resides above the level said printed circuit board and said bottom surface resides below the level said printed circuit board; and
wherein said insulative housing further comprises a plurality of alignment slots and said shield member assembly comprises a plurality of alignment features, said plurality of alignment features adapted to be received within respective ones of said plurality of alignment slots.

8. The electrical connector of claim 7, wherein said insulative housing comprises a lower surface, said lower surface having a plurality of terminals protruding therefrom, said lower surface of said insulative housing residing between the levels of said top and bottom surfaces of said shield member assembly.

9. The electrical connector of claim 8, wherein said shield member assembly comprises a plurality of tabs, said plurality of tabs residing substantially in plane with said lower surface of said insulative housing.

10. The electrical connector of claim 9, wherein said plurality of tabs comprises at least a first and a second tab, wherein the distance between a front surface of said shield member assembly and said first and said second tabs differs.

11. The electrical connector of claim 10, further comprising an ejection shield, said ejection shield resident within at least one of an upper or a lower transceiver receiving slot of said shield member assembly.

12. The electrical connector of claim 11, wherein at least a portion of said ejection shield is received within said insulative housing.

13. The electrical connector of claim 7, wherein said plurality of alignment features comprises at least two alignment features on a side surface of said insulative housing, wherein said at least two alignment features are resident on two different planes between the levels of said top and bottom surfaces of said shield member assembly, respectively.

14. A method of manufacturing an electrical connector mountable on a printed circuit board, comprising:
molding an insulative housing, said insulative housing comprising an upper and a lower printed circuit card receiving slot;
forming a shield member assembly, said shield member assembly comprising a top surface and a bottom surface;
inserting said insulative housing at least partly inside said shield member assembly thereby creating said electrical connector; and
disposing said electrical connector on said printed circuit board, wherein said top surface resides above the level of said printed circuit board and said bottom surface resides below the level of said printed circuit board;
wherein said act of forming said shield member assembly further comprises forming a plurality of tabs, said plurality of tabs residing substantially in plane with said lower surface of said insulative housing.

15. The method of claim 14, wherein said method further comprises disposing a plurality of terminals below the level of a lower surface of said insulative housing;
wherein said lower surface of said insulative housing resides between the levels of said top and bottom surfaces of said shield member assembly.

16. The method of claim 14, further comprising:
forming an ejection shield; and
placing said ejection shield within at least one of an upper or a lower transceiver receiving slots of said shield member assembly.

17. The method of claim 16, wherein said act of placing said ejection shield further comprises inserting at least a portion of said ejection shield within said insulative housing.

18. The method of claim 14, further comprising:
molding a plurality of alignment slots on said insulative housing; and
forming a plurality of alignment features in said shield member assembly, said plurality of alignment features adapted to be received within respective ones of said plurality of alignment slots.

19. The method of claim 18, wherein said plurality of alignment features comprises at least two alignment features on a side surface of said insulative housing, wherein said at least two alignment features are resident on two different planes between said top and bottom surfaces of said shield member assembly.

20. An electrical connector mountable on a printed circuit board in a telecommunications apparatus, comprising:
an insulative housing having an upper and a lower printed circuit card receiving slot; and
a shield member assembly at least partly enclosing said insulative housing and comprising an upper and a lower transceiver receiving cavity and further comprising a plurality of tabs, said plurality of tabs residing substantially in plane with said bottom surface of said insulative housing; and
wherein at least a portion of said lower transceiver receiving cavity resides below the level of said printed circuit board.

21. The electrical connector of claim 20, wherein said insulative housing comprises a bottom surface, said bottom surface having a plurality of terminals protruding therefrom, said bottom surface of said insulative housing residing between the levels of a top and a bottom surface of said shield member assembly.

22. The electrical connector of claim 20, wherein said insulative housing further comprises a plurality of alignment slots and said shield member assembly comprises a plurality of alignment features, said plurality of alignment features adapted to be received within respective ones of said plurality of alignment slots.

23. The electrical connector of claim 22, wherein said plurality of alignment features comprises at least two alignment features on a side surface of said insulative housing, wherein said at least two alignment features are resident on two different planes between said top and bottom surfaces of said shield member assembly.

24. An electrical connector mountable on a printed circuit board in a telecommunications apparatus, comprising:
an insulative housing having an upper and a lower printed circuit card receiving slot, said housing comprising a lower surface and a plurality of alignment slots; and
a shield member assembly at least partly enclosing said insulative housing and comprising a bottom surface and a plurality of alignment features, said plurality of alignment features adapted to be received within respective ones of said plurality of alignment slots; and wherein said bottom surface of said shield member assembly resides below the plane of said printed circuit board and said bottom surface of said insulative housing resides above the plane of said printed circuit board.

25. The electrical connector of claim 24, wherein said insulative housing lower surface comprises a plurality of terminals protruding therefrom, said lower surface of said insulative housing residing between the planes associated with a top and said bottom surface of said shield member assembly.

26. The electrical connector of claim 25, wherein said shield member assembly comprises a plurality of tabs, said plurality of tabs residing substantially in plane with said lower surface of said insulative housing.

27. The electrical connector of claim 24, wherein said plurality of alignment features comprises at least two alignment features on a side surface of said insulative housing, wherein said at least two alignment features are resident on two different planes between said top and bottom surfaces of said shield member assembly.

28. An electrical connector apparatus mountable on a printed circuit board in a telecommunications apparatus manufactured according to the method, comprising:
   molding an insulative housing, said insulative housing comprising an upper and a lower printed circuit card receiving slot;
   forming a shield member assembly, said shield member assembly comprising a top surface and a bottom surface and an upper transceiver receiving cavity and a lower transceiver receiving cavity with at least a portion of said lower transceiver receiving cavity being disposed below a lower surface of said printed circuit board when installed on said printed circuit board;
   forming a plurality of tabs in said shield member assembly;
   inserting said insulative housing at least partly inside said shield member assembly thereby creating said electrical connector such that said plurality of tabs reside substantially in plane with said bottom surface of said insulative housing;
   disposing said electrical connector on said printed circuit board, said printed circuit board comprising an upper surface and a lower surface with said insulative housing being disposed above said upper surface of said printed circuit board; and
   disposing a plurality of terminals below the level of a bottom surface of said insulative housing with said bottom surface of said insulative housing residing between the level of said top surface and the level of said bottom surface of said shield member assembly;
   wherein at least a portion of said electrical connector is disposed above the level of an upper surface of said printed circuit board; and
   wherein said top surface of said shield member assembly is disposed above said upper surface of said printed circuit board and said bottom surface of said shield member assembly is disposed below said lower surface of said printed circuit board.

29. The electrical connector apparatus of claim 28, further comprising:
   forming an ejection shield; and
   placing said ejection shield within at least one of said upper or said lower transceiver receiving cavity of said shield member assembly.

30. The electrical connector apparatus of claim 29, wherein said act of placing said ejection shield further comprises inserting at least a portion of said ejection shield within said insulative housing.

31. The electrical connector apparatus of claim 28, further comprising:
   molding a plurality of alignment slots within said insulative housing; and
   forming a plurality of alignment features in said shield member assembly, said plurality of alignment features adapted to be received within respective ones of said plurality of alignment slots.

32. The electrical connector apparatus of claim 31, wherein said plurality of alignment features comprises at least two alignment features on a side surface of said insulative housing, wherein said at least two alignment features are resident on two different planes between said top and bottom surfaces of said shield member assembly.

33. An electrical connector mountable on a circuit board, comprising:
   an insulative housing having a plurality of circuit card receiving slots; and
   a shield member at least partly enclosing said insulative housing, said shield member comprising a top surface and a bottom surface; and
   wherein said top surface resides above the level said circuit board and said bottom surface resides below the level said circuit board; and
   wherein said insulative housing further comprises a plurality of alignment slots and said shield member comprises a plurality of alignment features, said plurality of alignment features adapted to be received at least partly within respective ones of said plurality of alignment slots.

34. The electrical connector of claim 33, wherein said insulative housing comprises a lower surface, said lower surface having a plurality of terminals protruding therefrom, said lower surface of said insulative housing residing between the levels of said top and bottom surfaces of said shield member.

35. The electrical connector of claim 33, wherein said plurality of alignment features comprises at least two alignment features on a side surface of said insulative housing, said at least two alignment features resident on two different planes between the levels of said top and bottom surfaces of said shield member, respectively.

36. An electrical connector mountable on a circuit board, comprising:
   insulating housing means having a plurality of circuit card receiving means; and
   a shield member at least partly enclosing said housing means, said shield member comprising a top surface and a bottom surface; and
   wherein said top surface resides above the level said printed circuit board and said bottom surface resides below the level said printed circuit board; and
   wherein said housing means further comprises a plurality of first alignment means and said shield member comprises a plurality of second alignment means, said plurality of second alignment means adapted to be received at least partly within respective ones of said plurality of first alignment means.

* * * * *